Jan. 18, 1966 P. B. HELSDON 3,230,477

TRANSISTOR MULTIVIBRATOR RELAXATION OSCILLATORS
OF VARIABLE FREQUENCY

Filed July 12, 1963

INVENTOR
Peter Bennett Helsdon
BY Baldwin & Wight
ATTORNEYS

United States Patent Office 3,230,477
Patented Jan. 18, 1966

3,230,477
TRANSISTOR MULTIVIBRATOR RELAXATION OSCILLATORS OF VARIABLE FREQUENCY
Peter Bennett Helsdon, Chelmsford, England, assignor to The Marconi Company Limited
Filed July 12, 1963, Ser. No. 294,660
Claims priority, application Great Britain, Aug. 16, 1962, 31,473/62
5 Claims. (Cl. 331—113)

This invention relates to transistor oscillators and has for its object to provide improved and simple transistor multivibrator relaxation oscillators of adjustable frequency and which shall have a very wide range of frequency adjustment obtainable without the use of range-change switching or the like for selecting components of different values for switching into the circuit for changing the frequency range. The invention may be readily employed to provide an oscillator having a range of frequency adjustment, obtained without component-changing switching, of as much as 2500 to 1.

Figure 1:
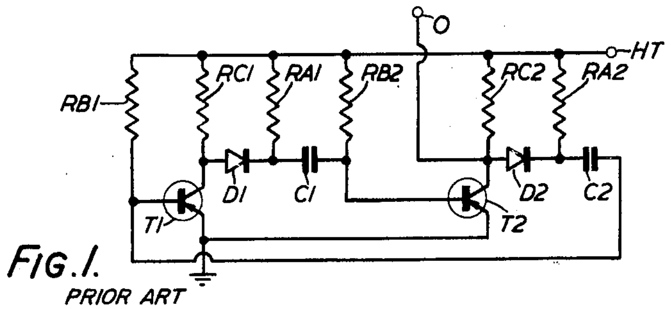
FIG. 1. PRIOR ART
Figure 2:
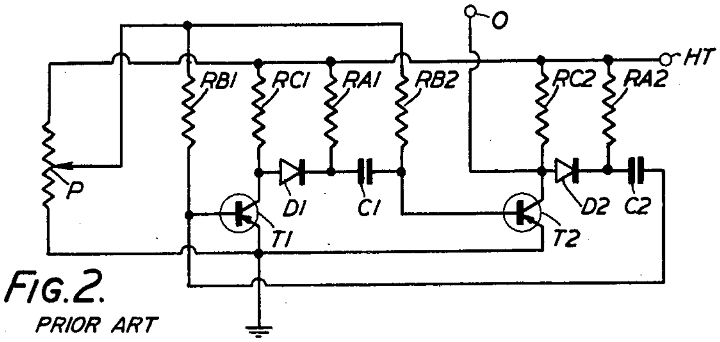
FIG. 2. PRIOR ART
Figure 3:
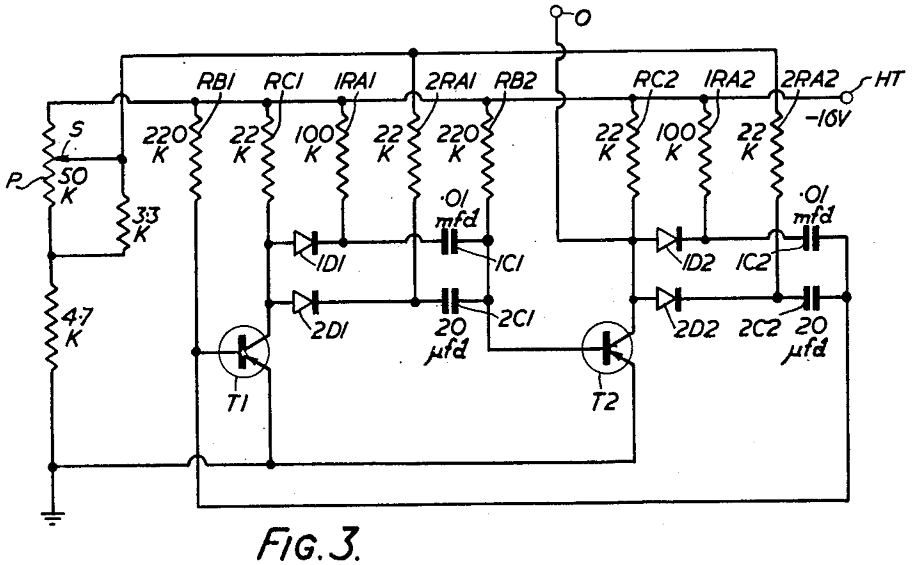

The invention is illustrated in and explained in connection with the accompanying drawings in which FIGS. 1 and 2 are diagrammatic representations, provided for explanatory and comparison purposes, of known transistor multivibrator relaxation oscillators and FIG. 3 is a diagram of an embodiment of this invention. Typical practical circuit component elements are marked in FIG. 3 adjacent the components to which they relate but these values are in no way limiting and are given by way of example only. Like references denote like parts in all three figures.

FIG. 1 shows a well known oscillator which generates square waves of good short rise times and substantially free of "tilt." The oscillator comprises two transistors $T_1$, $T_2$ of which $T_1$ has its collector coupled to the base of $T_2$ through an inter-stage coupling circuit comprising a diode $D_1$ in series with a condenser $C_1$, the collector of $T_2$ being similarly coupled to the base of transistor $T_1$ through an inter-stage coupling circuit comprising a diode $D_2$ in series with a condenser $C_2$. The collector main load resistors are referenced $R_{C1}$ and $R_{C2}$ and the base resistors are referenced $R_{B1}$ and $R_{B2}$. Good freedom from tilt is obtained, as is well known, because the diodes $D_1$ and $D_2$ in the inter-stage coupling circuits prevent the charge recovery currents of the condensers $C_1$ and $C_2$ in those circuits from flowing through the main collector load resistors $R_{C1}$ and $R_{C2}$, these currents being directed to flow through auxiliary load resistors $R_{A1}$ and $R_{A2}$ connected to the junction points of the diodes $D_1$ and $D_2$ with the condensers $C_1$ and $C_2$. This known circuit has, however, the defect that it does not lend itself to the obtaining of frequency variation.

FIG. 2 shows a known variant of the circuit of FIG. 1 adapted to provide a certain amount of frequency variation. As will be seen it differs from FIG. 1 in that the base resistors $R_{B1}$ and $R_{B2}$ are not returned to the H.T. terminal but, instead, are returned to a variable source of potential which, in FIG. 2, is constituted by the slider S of a potentiometer P connected across the H.T. source. In both FIGS. 1 and 2 the output terminal is referenced O. Although FIG. 2 will give a useful range of frequency variation, the attainable range is severely limited and is much less than is often required for many purposes e.g. in television test equipment. In practice it is very difficult to obtain a range of frequency variation much greater than 10/1 with a known circuit as shown in FIG. 2.

According to this invention the inter-stage coupling circuit or (if there be more than one) each of the inter-stage coupling circuits of a transistor multivibrator relaxation oscillator includes two circuits which are in parallel with one another and each of which includes a unilaterally conductive device in series with a condenser, and means are provided for varying with respect to one another the potentials to which the unilaterally conductive devices in the two said circuits are returned whereby, as the relative potential is varied, the proportional effect of the individual condensers in the two parallel circuits in determining the frequency of oscillation is varied.

According to a feature of this invention the inter-stage coupling circuit or (if there be more than one) each of the inter-stage coupling circuits of a transistor multivibrator relaxation oscillator includes two circuits which are in parallel with one another and each of which includes a unilaterally conductive device in series with a condenser and means are provided for varying the potential to which the unilaterally conductive device in one of the two parallel circuits is returned, the device in the other circuit being returned to a point of fixed potential and the whole arrangement being such that, as the variable potential is varied, the extent to which the condenser in said one of the two parallel circuits takes part in determining the frequency of oscillation is also varied.

Preferably the condenser in one of the two parallel circuits is much larger than that in the other and the unilaterally conductive device in the circuit containing the larger condenser is returned to a point of variable potential, the unilaterally conductive device in the circuit containing the smaller condenser being returned to a point of fixed potential.

Preferably the point of variable potential is the slider of a potentiometer connected across the normally provided H.T. source i.e. the main voltage source of the oscillator.

Preferably also the unilaterally conductive devices are semi-conductor diodes.

A preferred embodiment of the invention comprises two transistors; an inter-stage coupling circuit coupling the collector of each transistor with the base of the other; two parallel circuits each comprising a diode in series with a condenser in each coupling circuit, the condenser in one of said parallel circuits being many times as large as the condenser in the other; resistances connecting the junction points of the diodes with the smaller condensers to an H.T. voltage source for the transistors; and resistances connecting the junction points of the diodes with the larger condensers to a point of variable potential.

Comparing the embodiment shown in FIG. 3 with the known circuit of FIG. 2 it will be seen that each inter-stage coupling circuit in FIG. 3 consists of two parallel circuits. The parallel circuits in the coupling circuit between the collector of transistor $T_1$ and the base of transistor $T_2$ comprise the diode $ID_1$ and the series condenser $IC_1$ and the diode $2D_1$ and the series condenser $2C_1$. Condenser $2C_1$ is many times larger than condenser $IC_1$. The corresponding elements in the coupling circuit between the collector of transistor $T_2$ and the base of transistor $T_1$ are referenced $ID_2$, $IC_2$ and $2D_2$, $2C_2$, the condenser $2C_2$ being the same size as $2C_1$, and many times larger than $IC_2$ which is the same size as $IC_1$. The junction points of $ID_1$ with $IC_1$ and $ID_2$ with $IC_2$ are returned through high value resistances $IR_{A1}$ and $IR_{A2}$ to the H.T. terminal and the junction points of $2D_1$ with $2C_1$ and $2D_2$ with $2C_2$ are returned through smaller resistances $2R_{A1}$ and $2R_{A2}$ to a slider S on a potentiometer P connected in series with a 4.7K resistor across the H.T. source.

To simplify the following explanation of the embodiment shown in FIG. 3, assume the potentiometer P to be connected between H.T. and earth, i.e. the 4.7K resistor to be absent. When the slider S is at the "earthed" end of potentiometer P, the diodes $2D_1$ and $2D_2$ will never conduct and therefore the condensers $2C_1$ and $2C_2$ are effectively removed from the circuit. Accordingly the frequency is governed solely by the values of the smaller condensers $1C_1$ and $1C_2$ and is at its highest value.

The mode of circuit operation corresponding to the highest frequency of oscillation will be considered in more detail, starting with the assumption that transistor $T_2$ is conducting and transistor $T_1$ is cut off. With transistor $T_1$ nonconductive and the slider S positioned at the "earthed" end of the potentiometer P, the junction between diode $2D_1$ and condenser $2C_1$ will be very close to earth potential. At the same time the other junction between diode $1D_1$ and condenser $1C_1$ is at the H.T. potential of —16 volts. When transistor $T_1$ is rendered conductive, the collector of transistor $T_1$ and the junction between elements $2D_1$ and $2C_1$ will be at such potentials that no conduction can occur through the diode $2D_1$ and therefore the potential of the latter junction remains unchanged. For this reason no charge will be transferred from the left plate (in FIG. 3) to the right plate of condenser $2C_1$. But when transistor $T_1$ conducts, a current will flow from its collector through diode $1D_1$ and resistance $1R_{A1}$ to the negative H.T. terminal, which causes the potential of the junction between elements $1D_1$ and $1C_1$ to change suddenly from —16 volts to almost earth potential. This change of potential produces a charge transference from the left plate to the right plate of condenser $1C_1$. The only charge transference which takes place is in condenser $1C_1$, resulting in a rise in the potential of the base of transistor $T_2$ which now cuts off transistor $T_2$. The latter transistor will remain nonconductive until the charge on condenser $1C_1$ leaks off to the negative H.T. terminal through resistance $R_{B2}$. Only after sufficient charge has leaked away from condenser $1C_1$ for the potential of the base of transistor $T_2$ to fall to a suitable lower value does the transistor $T_2$ start conducting again, whereupon the action described above is reversed to cut off transistor $T_1$. The circuit operation corresponds to normal multivibrator action, but, since no transfer of charge occurs in condenser $2C_1$, that condenser has no effect upon the operation of the circuit. Accordingly the frequency of oscillation is determined solely by the time constant of condenser $1C_1$ and resistance $R_{B2}$.

The mode of circuit operation producing the lowest frequency of oscillation will next be explained. When the slider S is at the negative H.T. end of potentiometer P, the larger and smaller condensers in each of the inter-stage coupling circuits act effectively in parallel and the frequency is at its lowest value, being determined in the main by the larger condensers $2C_1$ and $2C_2$.

The detailed circuit operation at the lowest frequency will now be considered. With the slider S positioned at the negative H.T. end of the potentiometer P, when transistor $T_1$ is then rendered conductive both of the diodes $1D_1$ and $2D_1$ will conduct since prior to conduction by transistor $T_1$ the two junctions between the respective diodes and their respective condensers were both at the negative H.T. potential of —16 volts. Therefore when transistor $T_1$ conducts the potential at both junctions increases suddenly from —16 volts to approximately earth potential. As a result a maximum charge is transferred from the left plate to the right place of each of condensers $1C_1$ and $2C_1$, the charge transferred in each instance being equal to the product of the capacitance of the condenser and the voltage change. In this case the voltage steps are identical at each junction so that the charges transferred in the two instances correspond to a change of potential of the same magnitude and the condensers $1C_1$ and $2C_1$ act the same as a single equivalent condenser with a capacitance equal to the sum of the individual capacitances. Thus the multivibrator circuit oscillates at a frequency determined by the time constant of the combined or total capacitance of condensers $1C_1$ and $2C_1$ and resistance $R_{B2}$.

When an intermediate value of frequency is desired, it is only necessary to move the slider S to an intermediate setting upon the potentiometer P. With the slider S at any intermediate position, the voltage at the junction between elements $2D_1$ and $2C_1$ prior to conduction by transistor $T_1$ is intermediate earth potential and —16 volts, the exact value depending upon the setting of slider S. When the transistor $T_1$ is then rendered conductive, the potential of the junction between elements $2D_1$ and $2C_1$ changes from its intermediate value to approximately earth potential due to the current which flows from the collector of transistor $T_1$ through diode $2D_1$, resistance $2R_{A1}$, and the upper part of potentiometer P to the negative H.T. terminal. Accordingly an intermediate amount of charge is transferred from the left plate to the right plate of condenser $2C_1$ corresponding to the product of the capacitance of condenser $2C_1$ and the magnitude of the voltage step (i.e. from the intermediate value at slider S to earth potential), since charge is always equal to capacitance multiplied by voltage. Again, the charge transferred in condenser $2C_1$, together with the charge transferred in condenser $1C_1$ in the manner previously described, must leak away through resistance $R_{B2}$ before the base of transistor $T_2$ falls to a suitable lower value at which transistor $T_2$ will conduct. It can be seen that by varying the voltage applied to the junction of diode $2D_1$ and condenser $2C_1$, the amount of charge transferred in condenser $2C_1$ is varied. Since $Q=CV$, the result corresponds to maintaining a constant voltage step and varying the capacitance of condenser $2C_1$. Therefore at any intermediate position of the slider S, the frequency of the multivibrator is determined by the time constant of a capacitance $C_X$ and the resistance $R_{B2}$, where the aforesaid capacitance $C_X$ is equal to the capacitance of $1C_1$ added to an equivalent capacitance $C_e$ of $2C_1$, where $C_e$ equals the full capacitance of $2C_1$ (i.e. 20 microfarads in the example illustrated) multiplied by the ratio of the voltage corresponding to the intermediate position of slider S to the total H.T. voltage.

An experimental circuit connected and dimensioned as shown in FIGURE 3 gave a smoothly and continuously variable frequency over the range 0.1 c./s. to 250 c./s.—a range of 2500/1, which is much greater than is obtainable with a known circuit as shown in FIGURE 2.

I claim:

1. A transistor multivibrator relaxation oscillator with two interconnected transistor stages and having in each of the inter-stage coupling circuits thereof two circuit paths connected in parallel between the output electrode of one transistor and the input electrode of the other transistor, each of said circuit paths comprising a unilaterally conductive device connected in series with a condenser, the condenser being located at the input electrode end of the circuit path, means for applying potentials to said unilaterally conductive devices, and means for varying with respect to one another the potentials applied to the unilaterally conductive devices in the two parallel circuit paths whereby, as the relative potential is varied, the proportional effect of the individual condensers in the two parallel circuit paths in determining the frequency of oscillation is varied.

2. An oscillator as claimed in claim 1 wherein the condenser in one of the two parallel circuit paths is larger than that in the other and the unilaterally conductive device in the circuit path containing the larger condenser is connected to a point of variable potential, the unilaterally conductive device in the circuit path containing the smaller condenser being connected to a point of fixed potential.

3. A transistor multivibrator relaxation oscillator as claimed in claim 1 and wherein the unilaterally conductive device in one of said two parallel circuit paths is connected to a point of fixed potential and the other unilaterally conductive device is connected to a source of variable potential.

4. A transistor multivibrator relaxation oscillator as claimed in claim 1, wherein said oscillator includes a main voltage source for the transistors and wherein the unilaterally conductive device in one of said two parallel circuit paths is connected to a point of fixed potential and the other unilaterally conductive device is connected to a source of variable potential comprising the slider of a potentiometer connected across said main voltage source.

5. A transistor multivibrator relaxation oscillator comprising two transistors; a voltage source for the transistors; an inter-stage coupling circuit coupling the collector of each transistor with the base of the other; two parallel circuits each comprising a diode in series with a condenser in each coupling circuit, the condenser in one of said parallel circuits being larger than the condenser in the other; resistances connecting the junction points of the diodes with the smaller condensers to said voltage source for the transistors; and resistances connecting the junction points of the diodes with the larger condensers to a point of variable potential.

References Cited by the Examiner

UNITED STATES PATENTS

| | | | |
|---|---|---|---|
| 3,050,695 | 8/1962 | Du Vall | 331—113 X |

FOREIGN PATENTS

| | | |
|---|---|---|
| 790,941 | 2/1958 | Great Britain. |
| 833,242 | 4/1960 | Great Britain. |

ROY LAKE, *Primary Examiner.*

JOHN KOMINSKI, *Examiner.*

J. B. MULLINS, *Assistant Examiner.*